United States Patent
Baccou et al.

(10) Patent No.: US 8,364,449 B2
(45) Date of Patent: Jan. 29, 2013

(54) PROCESS FOR AUTOMATIC CREATION OF WIRING SIMULATION

(75) Inventors: Alain Baccou, Pibrac (FR); Patrice Marin, Clermont le Fort (FR)

(73) Assignee: Airbus Operations (S.A.S.), Toulouse (FR)

( * ) Notice: Subject to any disclaimer, the term of this patent is extended or adjusted under 35 U.S.C. 154(b) by 235 days.

(21) Appl. No.: 12/831,405

(22) Filed: Jul. 7, 2010

(65) Prior Publication Data

US 2011/0010157 A1  Jan. 13, 2011

(30) Foreign Application Priority Data

Jul. 8, 2009 (FR) ...................................... 09 54736

(51) Int. Cl.
*G06F 17/50* (2006.01)
*G06G 3/00* (2006.01)
(52) U.S. Cl. .................. 703/2; 703/5; 703/13; 716/112
(58) Field of Classification Search .................. 703/2, 5, 703/13; 716/112
See application file for complete search history.

(56) References Cited

U.S. PATENT DOCUMENTS
2008/0086705 A1   4/2008   Balasubramanian et al.

OTHER PUBLICATIONS

French Search Report, dated Jun. 10, 2010, from corresponding French Application.
Hauke Fuhrmann et al., "Model-based System Design of Time-triggered Architectures—Avionics Case Study", 25th Digital Avionics Systems Conference, Oct. 1, 2006, pp. 1-12; Cited in French Search Report.
Bernard Dion et al., "Model-based Development for Time-Triggered Architectures", Digital Avionics Systems Conference, Oct. 24-28, 2004, pp. 6.D.3-1-6.D.3-7; Cited in French Search Report.

*Primary Examiner* — Thai Phan
(74) *Attorney, Agent, or Firm* — Young & Thompson

(57) ABSTRACT

A process for automatic generation of functional digital simulation of an electronic system starting from a wiring specification base, whereby the system includes equipment, at least one connecting wire interconnecting the equipment, optionally inputs/outputs to other systems, includes: creating a wire table TC by selecting and extracting data from the wiring specification base, the wire table TC including the reference of equipment it is connected to and the equipment category at least for each wire of the electronic system to be simulated and for each end of the wire; creating a simulation table TS by transformating each line of the wire table TC by using rules specific to each pair of pieces of equipment connected by each wire; and creating a computer code interpreted by a simulator, by transformating each line of the simulation table TS into a set of computer code lines according to the input and output equipment.

20 Claims, 6 Drawing Sheets

| Indice | ATA | SeqPlan | Ext1 | BrNormal1 | BrSupp1 | TypEQ1 | Panneau1 | Zone1 | RacinePlanBr1 | Ext2 | BrNormal2 | BrSupp2 | TypEQ2 | Panneau2 | Zone2 | RacinePlanBr2 |
|---|---|---|---|---|---|---|---|---|---|---|---|---|---|---|---|---|
| 101 | 2434 | 101 | 3026VN017 | / | A | TN | | 262 | 3026VN017 | 1PE A | / | A | PB | | 262 | 1PE A |
| 102 | 2434 | 101 | 1PE B | 77 | | PB | | 262 | 1PE B | 3002VG018 | / | F | TN | | 262 | 3002VG018 |
| 103 | 2434 | 101 | 1PE B | 74 | | PB | | 262 | 1PE B | 3002VG018 | / | D | TN | | 262 | 3002VG018 |
| 104 | 2434 | 101 | 1PE B | 76 | | PB | | 262 | 1PE B | 3002VG018 | / | B | TN | | 262 | 3002VG018 |
| 105 | 2434 | 101 | 1PE B | 23 | | PB | | 262 | 1PE B | 3002VG018 | / | C | TN | | 262 | 3002VG018 |
| 106 | 2434 | 101 | 1PE B | 70 | | PB | | 262 | 1PE B | 3002VG018 | / | A | TN | | 262 | 3002VG018 |
| 107 | 2434 | 101 | 1PE B | 69 | | PB | | 262 | 1PE B | 3002VG018 | / | E | TN | | 262 | 3002VG018 |
| 108 | 2434 | 101 | 1PE B | 21 | | PB | | 262 | 1PE B | 3189VC017 A | 11 | | PA | 2533VU | 261 | 3189VC017 A |
| 109 | 2434 | 101 | 1PE B | 37 | | PB | | 262 | 1PE B | 3147VC017 A | 5 | | PA | 2533VU | 261 | 3147VC017 A |
| 110 | 2434 | 101 | 1PE B | 38 | | PB | | 262 | 1PE B | 3147VC017 A | 4 | | PA | 2533VU | 211 | 3147VC017 A |
| 111 | 2434 | 101 | 1PE B | 39 | | PB | | 262 | 1PE B | 2005VC015 | 8 | | JA | | | 2005VC015 |
| 112 | 2434 | 101 | 1PE B | + | | AE | | 262 | 1PE B | 3130VT017 | 1 | C | TG | 2506VU | 262 | 3130VT017 |
| 113 | 2434 | 101 | 1PE B | - | | AE | | 262 | 1PE B | 3016VN017 | / | A | TN | | 262 | 3016VN017 |
| 114 | 2434 | 101 | 1PE B | 26 | | PB | | 262 | 1PE B | 3057VC017 A | 44 | | PA | 2533VU | 261 | 3057VC017 A |
| 115 | 2434 | 101 | 1PE B | 66 | | PB | | 262 | 1PE B | 3057VC017 A | 45 | | PA | 2533VU | 261 | 3057VC017 A |
| 116 | 2434 | 101 | 1PE B | 46 | | PB | | 262 | 1PE B | 3057VC017 A | 46 | | PA | 2533VU | 261 | 3057VC017 A |
| C/B - 22PE | | | | | | | | | | | | | | | | |
| 201 | 2434 | 101 | 22PE | C2 | 2 | CB | 2516VU | 262 | 22PE | 1PE A | CC | X1 | PB | | 262 | 1PE A |
| 202 | 2434 | 101 | 22PE | A2 | X2 | CB | 2516VU | 262 | 22PE | 1PE A | AA | 11 | PB | | 262 | 1PE A |
| 203 | 2434 | 101 | 22PE | B2 | | CB | 2516VU | 262 | 22PE | 1PE A | BB | | PB | | 262 | 1PE A |
| C/B - 19PE | | | | | | | | | | | | | | | | |
| 301 | 2434 | 101 | 10PE | | | | 2502VU | 262 | 2502VU1 | 19PE A | | | | JA | 2533V U | 261 |
| 302 | 2434 | 101 | 19PE A | | | | 2503VU | 261 | 2503VUA | 3189VC017 | | | | | | |
| C/B - 11PE | | | | | | | | | | | | | | | | |
| 401 | 2434 | 101 | 6PE A | | G | X | 2506VU | 262 | 6PE A | 11PE | | 1 | | CB | 2501V U | 261 |
| 402 | 2434 | 101 | 11PE | | 2 | CB | 2501VU | 261 | 2501VU3 | 3147VC017 | | 4 | | JA | 2533V | 261 |

Fig. 3A

| | | | | | | | | | | | |
|---|---|---|---|---|---|---|---|---|---|---|---|
| 501 | 2434 | 101 | 3181VT017 | 1 | | | | 2500VU | 260 | 3181VT017 | 3147VC017 | | | | |
| ICP01 - 1231VM | | | | | | | | | | | | | | | |
| 601 | 2434 | 101 | 1231VM | A | <Q | TM | PB | | 211 | 1231VM | A | 2005VC015 | A | 001 | | |
| CONTACTOR - 6PE | | | | | | | | | | | | | | | |
| 701 | 2434 | 101 | 6PE | B | | 21 | PB | 2506VU | 262 | 2506VU | | 3057VC017 | | | 5 | JA | 2533V | U | 261 |
| 702 | 2434 | 101 | 6PE | B | | 19 | PB | 2506VU | 262 | 2506VU | | 3180VT017 | 4 | | 8 | PA | | 211 |
| RELAY - 15XE | | | | | | | | | | | | | | | |
| 801 | 2434 | 101 | 15XE | A | | 1 | X | 2503VU | 261 | 2503VUC | | 6PE | B | | 44 | JA | 2533V | U | 261 |
| 802 | 2434 | 101 | 15XE | A | | 3 | X | 2503VU | 261 | 2503VUC | | 6PE | B | | G | 1 | | |
| 803 | 2434 | 101 | 15XE | A | | A | X | 2503VU | 261 | 2503VUC | | 3057VC017 | | | 3 | PB | 2506V | U | 262 |
| 804 | 2434 | 101 | 15XE | A | | B | X | 2503VU | 261 | 2503VUC | | 3057VC017 | | | 5 | PB | 2506V | U | 262 |
| | | | | | | | | | | | | | | 45 | | | |
| | | | | | | | | | | | | | | 46 | | | |

Fig. 3B

PROCESS FOR AUTOMATIC CREATION OF WIRING SIMULATION

The invention pertains to the general field of simulation. More particularly, it relates to the simulation of vehicle operation, as used in, for example, flight simulators.

CONTEXT OF THE INVENTION AND PROBLEMS POSED

In the aeronautical field, simulators of aircraft operation have been used for many years, as much for pilots to familiarize themselves with the layout of the cockpit of a new aircraft and the behavior of the equipment of the aircraft during their actions in this cockpit as for the initial development of the aircraft.

Such simulators should be extremely faithful to the operation of the simulated aircraft, which actually consists of a set of thousands of pieces of equipment connected together.

Technically, several stages are distinguished in the simulation of an aircraft program:

The development simulation that constitutes the initial simulation of the aircraft components in a universe that is simulated by means of a PC, in particular.

The so-called integration simulation that corresponds to a battery of tests conducted with actual computers. Very often, tests are performed by means of a general bank that is called and that picks up in particular the set of electric and hydraulic circuits on full scale, making it possible to validate the set of systems so as to prepare the first flight.

The integration simulation is thus used to test the validity of the aircraft design and first comprises only simulated equipment. It then integrates actual on-board components on the actual aircraft and thus follows the entire study phase of the final aircraft.

As for the training simulation, it represents the final stage of the design; it is used to train pilots and maintenance personnel and should in this sense be the most faithful representation of reality that is possible.

The simulated cockpit of the aircraft is then recreated in a manner that is visually analogous to the actual cockpit, and the apparent interface of each piece of piloting equipment is made in a manner that is as close to reality as possible. The other pieces of equipment of the aircraft can be simulated.

The operation of each piece of equipment is most often simulated by computer means, its state at each moment being determined based on data received from other pieces of equipment and algorithmic operating rules of said equipment. In return, the piece of equipment sends information on its state to certain other pieces of equipment.

In general, these simulation models are coded by using a meta language in the form of formal, functional graphic schemas, for example coded in XML language, and then transformed by an automatic coding module into code C, representative of a graph and simulation nodes and directly executable by an aircraft simulator.

Such simulation software, for example a commercial SCADE (registered trademark)-type software, is an integrated development environment that is used to design, simulate, verify and develop the on-board code of the critical real-time systems, such as aeronautical equipment, automobile systems or railroad signaling systems.

Such a language is both a diagrammatic-type language (with graphic representations) and a formal language that is based on structured semantic rules, analogous to the XML language.

This type of simulation software is similar to the software that is known under the trade name 'Matlab Simulink' (registered trademark). It uses formal, functional graphic schemas (design by models) for precise specifications and a facilitated dialogue. It involves a so-called synchronous time software as appeared in the 1980s. Once described, the specifications can be executed.

From a theoretical standpoint, these simulation languages "manipulate infinite series, each of these series representing the changes of an input/output signal of the system over time" (Pouzet, thesis 2007). In one synchronous time model, all of the processes that are put in parallel share the same overall time scale.

The aircraft simulator on which the process according to the invention is to be implemented uses the C-type code that is generated by the simulation software. In an interactive graphic mode, the simulator is a very powerful tool for detecting errors in design or problems of operation or of compatibility between pieces of equipment, during the design stage of aircraft systems.

The on-board code in C or Ada language is generated automatically starting from the model of formal, functional graphic schemas created by the developers of models ("Model Developers" in English) and is considered to be qualified for being placed on board aircraft that are equipped with real-time systems. The importance of the validity of this code is therefore obvious, just like its quick availability during the design and testing phase.

Each piece of equipment is therefore either actually integrated into the simulator or simulated in software form, the different software blocks corresponding to the pieces of equipment that exchange information with one another in accordance with the wiring diagram of the actual aircraft.

The simulation of the wiring diagram is therefore an essential element of any functional simulation of the aircraft.

Here, the wiring definition includes not only the wires themselves, but also simple elements called semi-equipment, whose complexity is very inferior to the equipment of the aircraft. These pieces of semi-equipment can comprise, for example, relays, circuit breakers, etc. Their operation is also to be simulated.

It is understood that as many different pieces of equipment are standard in nature and their algorithms can be represented in an unchanged software manner regardless of the use of the equipment, the wiring of these pieces of equipment relative to one another can vary greatly from one aircraft to the next based on, for example, layout and operational requirements of the different clients of an aircraft model, each time leading to a specific wiring diagram.

Each of these wiring diagrams is then to be tested, as much to evaluate its proper design phase operation as to be simulated in a general flight simulator of the aircraft, or to test degraded operating modes in the case of a failure of a set of wiring elements or equipment.

Beyond a use in these flight simulators that are equipped with sophisticated display interfaces, the functional evaluation of a wiring diagram can also be made necessary by modifications of this wiring between two aircraft that are produced to verify the proper operation of said wiring. A digital simulation of this wiring is then desirable to test, according to an input value at a point of the diagram, the output values at various other points of the diagram.

In these two cases, the lines of software code that correspond to the wiring diagram of the equipment relative to one another are currently created manually for each new wiring configuration. This leads to very significant development times and constitutes an inevitable error source when tens of thousands of connecting wires that are present in a current aircraft are considered.

The cost that is associated with each simulation is also significant and the time between two successive simulations during the design of a wiring diagram for validation is considerable.

This invention therefore has as its object eliminating these drawbacks by proposing a process for creating wiring simulation that is automatic.

A second object of the invention is then to significantly reduce the time and the cost of each creation of a wiring diagram simulation.

A third object of the invention is to make it possible to take into account a series of pieces of semi-equipment in the automatic creation of simulation.

DISCLOSURE OF THE INVENTION

For this purpose, the object of the invention is first of all a process for generating functional digital simulation of an electronic system starting from a wiring specification base BD1 of this electronic system, whereby said electronic system comprises equipment, at least one connecting wire that connects the pieces of equipment to one another, whereby said wiring specification base BD1 exhaustively lists the inputs and outputs of each wire of this electronic system and comprises in particular for each wire: the nomenclature of its two ends, the type of equipment that is connected at each end, and the references of this equipment, the system or sub-system on which the wire depends, whereby the process comprises stages:

101—For creating a wire table BD2 by selection and extraction of data from the wiring specification base BD1, whereby said wire table BD2 comprises the reference of the equipment to which it is connected and a classification category of said equipment at least for each wire of the electronic system to be simulated and for each end of said wire, 104—For creating a simulation table TS by transformation of each line of the wire table BD2 by using transformation rules that are specific to each pair of pieces of equipment connected at the two ends of each wire, 105—For creating a set of computer code instructions that can be interpreted by a simulator, by transformation of each line of the simulation table TS into a set of computer code lines according to the input and output equipment.

It is understood that a process for creating simulation without intervention from the developer of models ("model developer"), and by therefore eliminating both the tedious wire-to-wire coding work of the latter and possible coding errors, is thus created.

By observing the recurrence of similar semi-components in the wiring boards that were previously recoded upon each redundancy because of the manual procedure:

An improvement in productivity and efficiency in the generation of models,

A reduction in the sources of errors because of the recurrent coding of the semi-equipment, and therefore faster validation of the models, and Better traceability of the developed models were therefore obtained.

According to a particular implementation of the process, the latter also comprises a stage:

102—For creating a semi-equipment library S-E library that defines a logical functioning algorithm, stored in the form of a formal, functional graphic schema that uses elementary predefined representation blocks, for a set of at least one piece of equipment of the electronic system called a piece of semi-equipment.

This arrangement corresponds to taking into account pieces of semi-equipment that are not wires per se but that operate according to a very simple logical algorithm relative to the major equipment of the aircraft.

According to a particular implementation of the process, the latter also comprises a stage:

103—For integrating components that are listed in the wire table BD2 in a meta simulation model in the form of formal, functional graphic schemas made of a single node or several nodes, whereby each node represents a system.

According to an advantageous implementation in the model that is generated, each simulation node simulates a system and each equation of this node simulates the corresponding subsystems.

According to a particular implementation of the process, the stage 104 for creating a simulation table TS implements a connecting function, written in simulation software working in the form of functional graphic blocks, having as its object to connect the inputs and the outputs of the components using the database BD1 of wiring inputs and outputs, whereby the two inputs of this connecting function are:

1/ On the one hand, the wire table BD2 of the inputs and outputs of each aircraft wire, 2/ On the other hand, the screen of the meta simulation model, i.e., the simulation blocks of equipment and sub-equipment, excerpts from the library S-E Library, although they are part of the components that are connected at the ends of the wires listed in the wire table BD2.

According to a particular implementation of the process, the connecting function runs through the wire table BD2 line by line, and proceeds as the software blocks simulating the semi-equipment library S-E library corresponding to the wire end components are loaded, incorporated into the code in the form of procedures, then carries out the processing of the wires themselves by determining the direction of passage of the current that runs through them, and their equivalent coding.

According to a particular implementation of the process in stage 104 the determination, for all of the origins and destinations of the wires of the electronic system, of their input or output nature, uses an algorithm as follows:

1/ For all of the components that are listed in the library S-E library, the links that are possible between the pins of the connectors of this component are defined, 2/ Then, at least one of the ends of a wire of the electronic system is set as having to be an input or an output, starting from a set of initial rules using the formal graphic definition of the semi-equipment, 3/ Then, the nature of the different ends of all of the wires of the system that is to be simulated are propagated by routing one end of a component to another end of this component, and one end of a wire to the other end of this same wire.

This implementation makes it possible to gradually determine the direction of different wires of a wiring board by using the internal logic of each component, which restrains the nature of a certain number of pins and therefore wire ends. The "viral" propagation of the natures of the wire ends then makes it possible to establish all of the natures of the wire ends.

According to a particular implementation of the process, the database of wiring specifications BD1 also comprises references to the wiring boards including the positions to which this component is to be drawn on the wiring board for each wire, the wire table BD2 corresponds to at least one wiring board, in stage 101, the wire table BD2 also comprises the design coordinates of each component on each wiring board, and the simulation table TS also comprises design coordinates of each simulation block of a component on a simulation board, whereby these coordinates are selected to be identical to the design coordinates of said component in the wire table BD2.

This arrangement makes it possible for the developer of models ("model developer") to very easily carry out visually a first verification of conformity of the wiring model with the original wiring board, whereby the simulation board is superposed there component to component.

According to a particular implementation of the process, the simulation table TS is created in an XML-type graphic language.

The purpose of the invention is also a computer program product, comprising a set of program code instructions adapted to implement a process as disclosed when said program is executed on a computer.

The purpose of the invention is also an electronic system simulator whose algorithmic definition is obtained by a process for functional digital simulation generation that is described.

Its purpose is also an electronic circuit that acts as an electronic system simulator, whose algorithmic definition is obtained by the process for functional digital simulation generation that is described.

Under a second aspect, the purpose of the invention is a process for creating a semi-equipment library S-E Library, whereby said semi-equipment, defined by predetermined standards, is designed to be integrated into at least one electronic system, whereby this process is such that the library S-E Library comprises—for at least one piece of semi-equipment—a logical functioning algorithm that represents it, presented in the form of generic simulation blocks (formal, functional graphic schemas) that are compatible with a simulation language.

According to a particular implementation of this process for creation of a semi-equipment library, the generic simulation blocks have inputs and outputs that are identified.

More particularly, in this case, in an advantageous implementation, the process for creating a semi-equipment library comprises the sub-stages of:

1—Listing all of the standards that correspond to all of the components that are connected at the wire ends of an electronic sub-system that it is desired to simulate, 2—Coding, for each standard, of the corresponding semi-equipment, whereby this sub-stage comprises phases:

2a—For analysis of the nomenclature and the functioning algorithm of the semi-equipment, 2b—For coding the logic of the semi-equipment in a simulation block in the form of a formal, functional graphic schema that can be interpreted by simulation software.

According to an even more particular implementation in this case, the components that are connected at the ends of wires of an electronic subsystem that it is desired to simulate are identified:

by creation of a wire table BD2 that comprises the reference of the equipment to which it is connected, the category of said equipment, at least for each wire of the electronic system to be simulated and for each end of said wire, by extraction from said wire table BD2 of inputs and outputs of all of the registrations that correspond to the wires of the electronic system, and listing standards of the equipment that are connected at the ends of these so-called wires.

According to a particular implementation of this process for creation of a semi-equipment library, it also comprises a phase:

2c—for generation of a code C equivalent of the logic of the semi-equipment by a tool for automatic translation of graphic functional blocks of code C, and then integration in the library S-E Library.

According to a particular implementation of this process for creating a semi-equipment library, the simulation blocks are compatible with the formalism of a preselected wiring specification base, i.e., each block comprises the standard of the simulated semi-equipment and the inputs/outputs comprise the same name as the pins of the semi-equipment in this wiring specification base.

According to a particular implementation of this process for creating a semi-equipment library, it also comprises A stage for extraction, from a database of wiring specifications BD1, whereby said base BD1 exhaustively lists the inputs and outputs of each wire and comprises in particular for each wire: the nomenclature of its two ends, the type of equipment that is connected at each end, and the references of this equipment, the system or sub-system on which the wire depends, said wiring specification database BD1 corresponding to the electronic system that it is sought to simulate, for each component listed in this base, its frequency of use in the wiring, And a coding stage in the library S-E library of the standards of the components, by being limited to the components that have a frequency of use that is higher than a predetermined threshold.

The purpose of the invention is also a computer program product, comprising a set of program code instructions that are suitable for implementing a process for creating a semi-equipment library as disclosed when said program is executed on a computer.

BRIEF DESCRIPTION OF THE FIGURES

The objects and advantages of the invention will be better understood from reading the description and drawings of a particular embodiment, provided by way of nonlimiting example, and for which the drawings show:

FIGs. 3A and 3B: Excerpts from the database of inputs and outputs of aircraft wiring

DETAILED DESCRIPTION OF AN EMBODIMENT OF THE INVENTION

Hereinafter, all of the components such as the computers, engines, hydraulic components, etc., of the aircraft are called pieces of equipment.

In contrast, the pieces of semi-equipment are the 'basic' components that make the link between these various pieces of equipment. To cite some of them: relays, switches, circuit breakers for the electric portion of the aircraft.

These pieces of semi-equipment each have particular characteristics of behavior and are the key elements for interconnection between the different parts of the aircraft system.

The term model will be used to designate the major functions of the aircraft: electrical, hydraulic, fuel, engines, etc.; the term system or sub-system will be used to designate a set of pieces of equipment and sub-equipment that are assembled to implement a particular function of the aircraft; and the term components will be used to designate both the equipment and the semi-equipment.

The components are connected to one another by wires that make it possible to transfer between them information or power and that form a wiring diagram.

The following description is provided for a simple wiring diagram, which comprises only some pieces of equipment and semi-equipment and several tens of wires, so as to facilitate the understanding thereof. It is obvious that the process can be extended to an arbitrarily large wiring diagram, without substantial modification.

Figure 7:
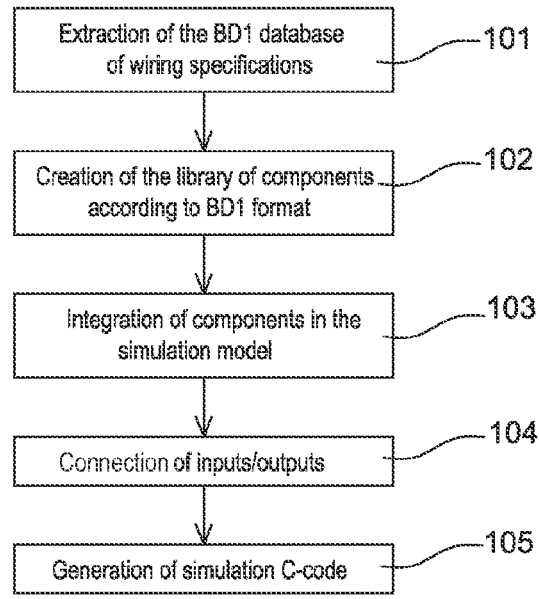
FIG. 7: A schematic illustration of the stages of the process according to the invention

The principal stages of the process for automatic generation of simulation of an aircraft system are illustrated in a diagram, FIG. 7.

It is noted in a preliminary way that the process according to the invention is called software-coded and has been implemented by a PC-type computer means, presumably connected here, in a way that is not at all limiting, by network to a server on which are stored databases of specifications of the aircraft's components.

This PC is equipped at least with known software means for database management, display, and simulation software using formal, functional graphic schemas, for example a synchronous time software for design by models of known type under the trade name SCADE (registered trademark).

In this description, it is considered, as is the general case in practice, that there is a database of wiring specifications BD1 exhaustively listing the inputs and outputs of each aircraft wire for the different systems for the aircraft for which it is desired to simulate a system.

This base BD1 is generally available in the form of spreadsheet-type files or, for more convenience, in visual form of wiring boards that are easier to verify by the Studies Offices.

It comprises, i.a., for each wire: the nomenclature of its 2 ends, the type of equipment that is connected at each end and the references of this equipment, references to the wiring boards including the positions in which this component is to be designed on the wiring board, the system (ATA, for example ATA 27 for the flight controls, ATA 24 for electrical supply, ATA 32 for the landing gear, etc.) or sub-system (sub-ATA) on which the wire, etc., depends.

It also comprises, for all of the components that are listed as being connected at the ends of the aircraft wiring, their correspondence and their nomenclature.

The information from this database of wiring specifications BD1 is virtually exhaustive for all of the systems of an aircraft, including the electrical systems, hydraulic systems, fuel, engines, etc.

In addition, this database of wiring specifications BD1 is updated for each change of an aircraft in production.

Figure 1:
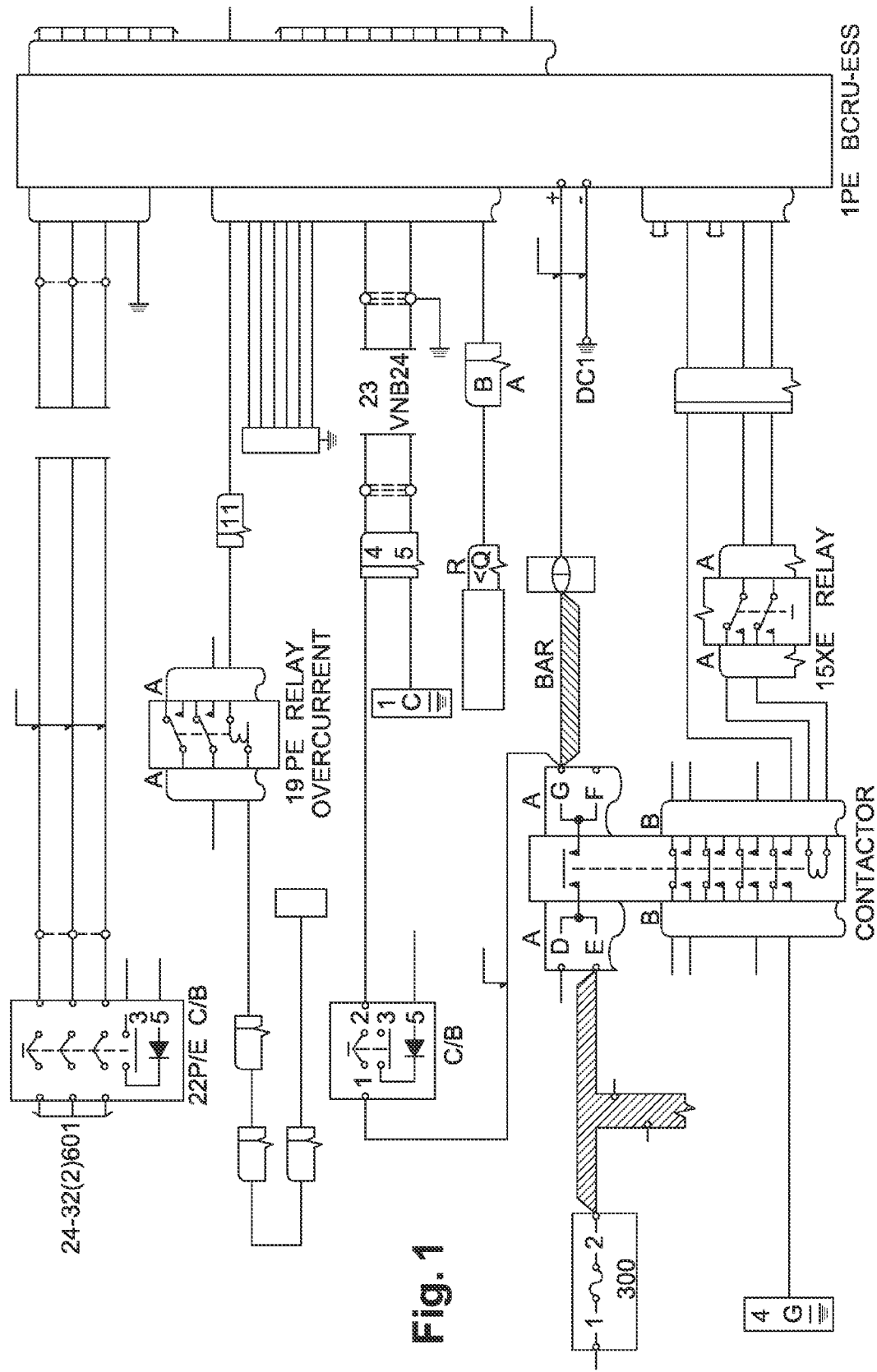
FIG. 1: An example of the wiring board that is extracted from the wiring database

FIG. 1 illustrates a typical aircraft wiring board, extracted from the database for defining aircraft wiring BD1 for a sub-system of the electrical model. Such a wiring board for an aircraft sub-system defines all of the wires that connect two by two a set of equipment that is represented by rectangles comprising internal symbols that represent their function. It is noted that this wiring board does not provide information on the direction of the current circulating in the different wiring.

It is a simple assembly diagram, not a functional diagram. It does not comprise logic in itself.

The observation of FIG. 1 shows that a typical wiring board comprises equipment (computer 1), several pieces of semi-equipment (circuit breakers 2, 3, switch 4, overvoltage relay 5, relay 6, connector 12, . . . ), particular BusBar-type connectors 7, 8, and connecting wires between these diverse components, optionally connected to grounds 10, 11.

This wiring board is connected to other boards by numerous inputs and outputs that are typically referenced "24-32 (2)601" for the circuit breaker 2, which provide the number of the system concerned (ATA 24), the sub-system and the reference of the connected component.

The simulation of this wiring board is therefore to involve the simulation of each of these pieces of equipment and semi-equipment, particular connectors and wires and is to take into account outside systems to which the board is connected.

If software blocks that simulate the equipment exist generically and are adapted to being integrated into the simulation of any wiring board, regardless of its structure, there is no automatic tool for simulation of the other components of the wiring board, nor of its wires themselves or particular connectors.

The following description proposes such an automatic process for creating simulation of a wiring board.

The first stage 101 of this process is a selection and an excerpt of information from the database of wiring specifications BD1 of inputs and outputs of all of the aircraft wiring.

In a file in the form of a spreadsheet that corresponds to the database BD1 of the inputs and outputs of each aircraft wire, each line refers to a wire and to its two ends.

Starting from the wiring board of FIG. 1 or the database of specifications of equivalent wiring BD1, different 'wires' that correspond to said wiring board are extracted by a known software means, and an exhaustive list of the latter is created.

Among all of the information that is available in the database BD1, certain columns are selected that will be pertinent for the development of the automated process for generation of simulation.

In particular, the fields 'ext1' and 'ext2' of the database of wiring specifications BD1 contain the name of components (ex: the referenced relay 15XE) to which the two ends of a given wire are connected.

To determine the type of component that they represent, reference is made to fields of the database of wiring specifications BD1, which comprise the standard corresponding to each component that is connected to a wire (the standard E0247AOS corresponds to the relay that is referenced 15 XE).

Among the fields that are extracted from the database of wiring specifications BD1 and registered in a new file BD2 (wire table TC), there are, in particular, the following:

ATA: Reference of the sub-system involved (will make it possible to optionally select the ATA or sub-ATA of which it is desired to create the model).

Ext1: Reference of the component to which the wire (ex 15XE) is connected at its end 1, and optionally the portion of the component BrNormal1: Pin of the component 1 to which the wire is connected TypeEQ1: Category of the component t that is connected at the end 1 of the wire Ext2: Reference of the component to which the wire is connected at its end 2 and optionally the portion of the component BrNormal2: Pin of the component 2 to which the wire is connected TypeEQ2: Category of the component that is connected at the end 2 of the wire Temp_RefSolLiasse: Standard corresponding to the component of the end 1

Rep_RefSolLiasse: Standard corresponding to the component of the end 2

This therefore represents the fields that provide exhaustive information concerning the listing of all of the E/S integrated into the model in the form of formal, functional graphic schemas.

Starting from the raw data that are selected and extracted from the database of wiring specifications BD1 (wiring boards), a BD2-derived database (called a wire table) consists in the form of a new file. Excerpts from the database of wiring specifications BD1, in the form of a spreadsheet, are provided in FIGS. 3A and 3B. References of primary components of the wiring board of FIG. 1 are found there, with data corresponding to some of the fields cited by way of example.

Stage 102 consists in developing a semi-equipment library S-E Library in the form of formal, functional graphic schemas (compatible with a SCADE (registered trademark)-type simulation software) comprising simulation blocks that correspond to the standards of various pieces of semi-equipment that are listed in the registrations of the wire table BD2.

In other words, this semi-equipment library S-E Library defines for a set of pieces of semi-equipment their logical functioning algorithm, recorded in the form of a formal, functional graphic schema that uses elementary blocks of pre-defined representation.

To do this, it is first necessary to list all of the standards that correspond to all of the components that are connected at the ends of wires, extracted from the file in spreadsheet form of the wire table BD2 of inputs and outputs of all of the aircraft wiring. This comes down to identifying all of the components one by one on the wiring board that is studied.

Then, for each standard corresponding to a component that is listed in the wire table BD2 of inputs and outputs of aircraft wiring (or a sub-system that it is desired to simulate by itself), the corresponding semi-equipment in the wiring boards is coded. The nomenclature and the functioning algorithm of the semi-equipment are studied, and then its logic is coded in a simulation block, in the form of a formal, functional graphic schema (for example, in the XML language), interpretable by a SCADE (registered trademark)-type simulation software.

Figure 2:
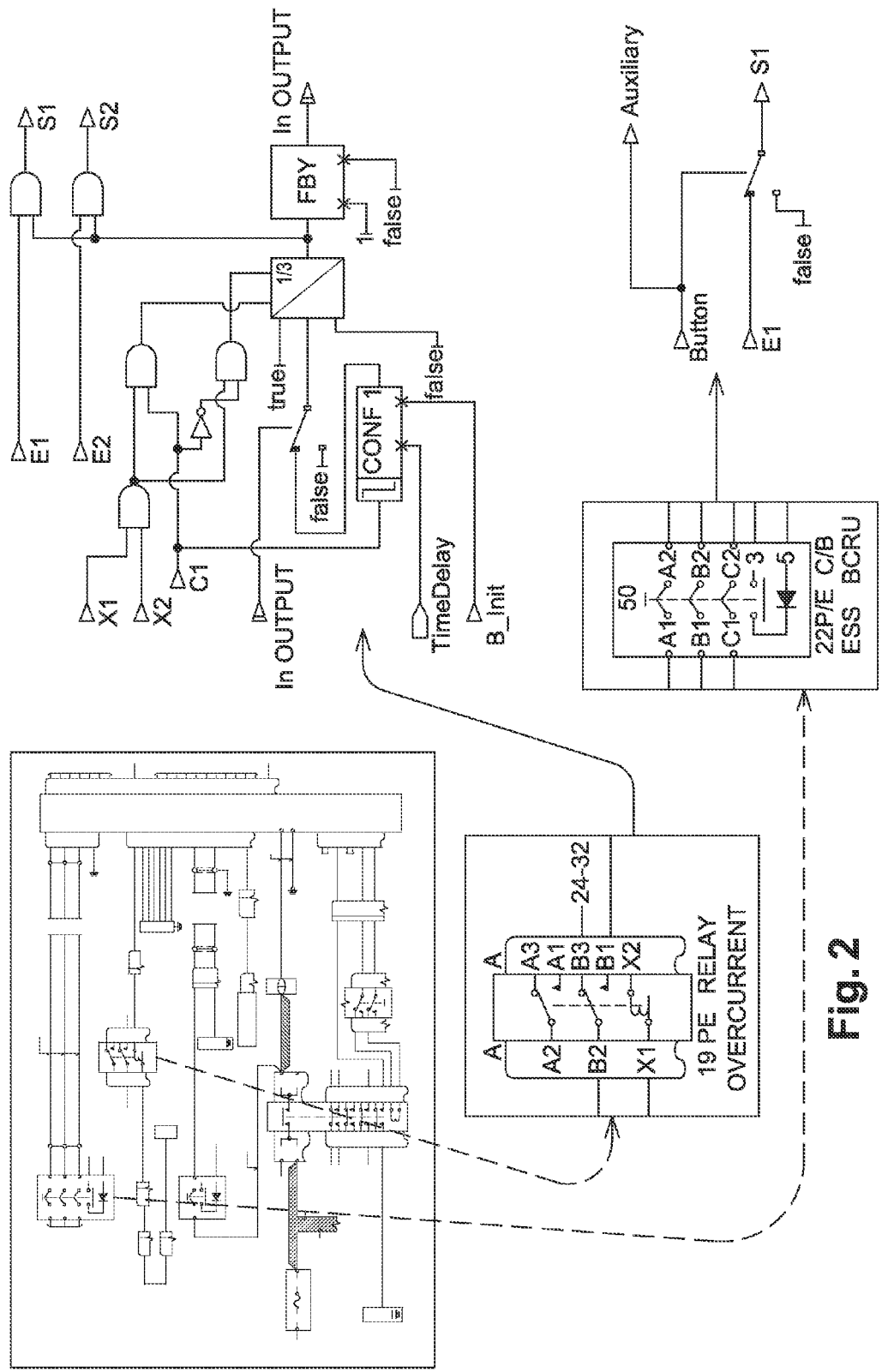
FIG. 2: The stages for creating the semi-equipment library
Figure 4:
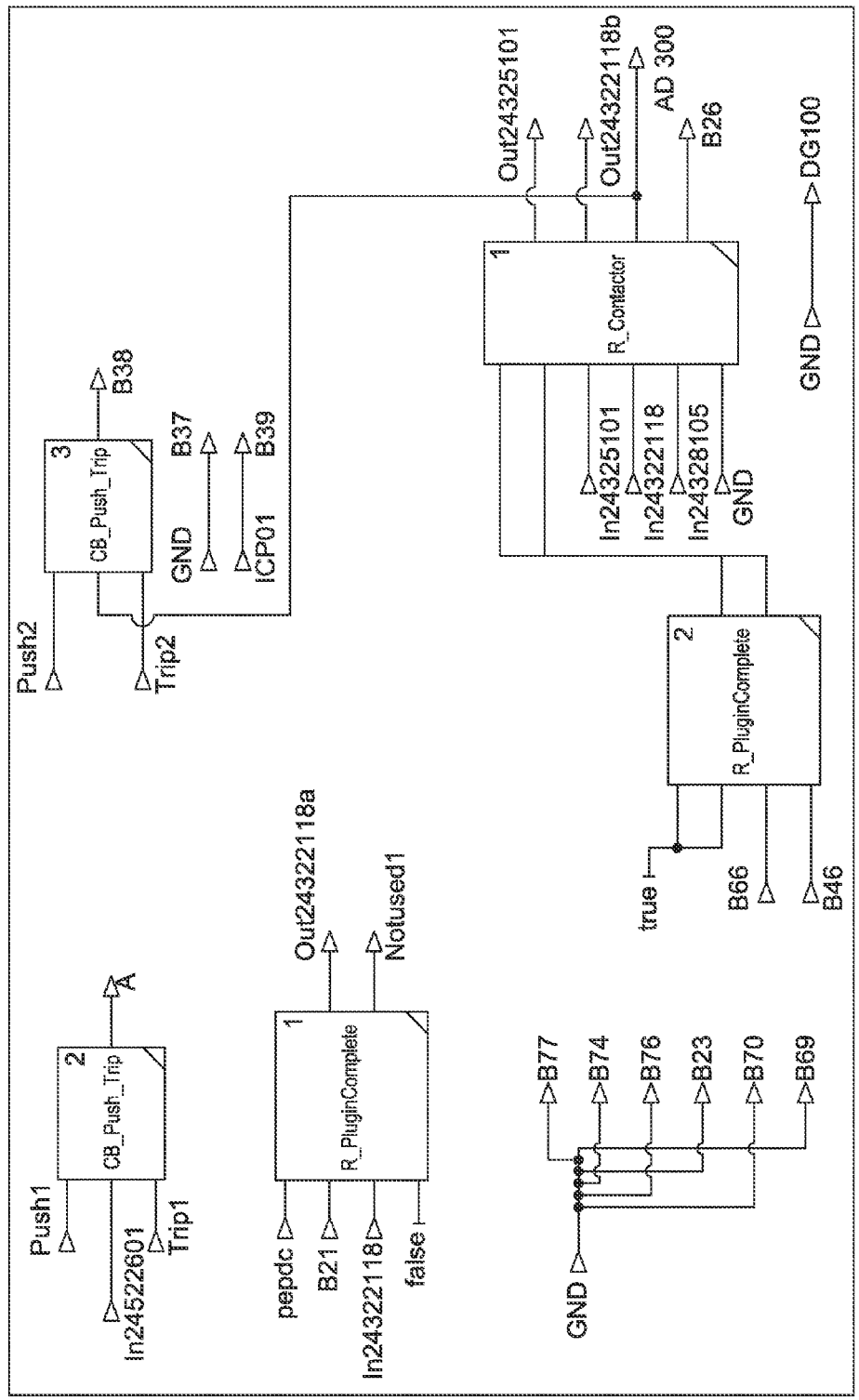
FIG. 4: A simulation board in the form of functional graphic blocks

FIG. 2 provides an example that shows the targeting of two pieces of equipment 4, 5 on the wiring board of FIG. 1, their codes and their respective schematic representations 4', 5' in the simulation software.

Figure 5:
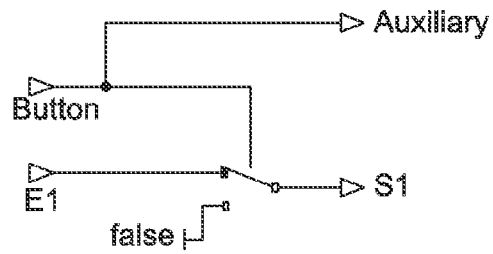
FIG. 5: A schematic drawing that is equivalent to the semi-equipment referenced C/B 22PE

In this example, for a piece of semi-equipment referenced CB22P/E (component 2 in FIG. 1), i.e., a component that is known under the common designation of "Circuit Breaker with Auxiliary Contact," referenced in the wiring board illustrated in FIG. 2, the associated algorithm is the following:

```
If Push=1
  Then S1=0 AND Auxiliary=1
  Else S1=E1
``` and the associated schematic drawing in the form of formal graphics is illustrated in FIG. 5. This schematic drawing is a formal presentation that is equivalent to a coding of the mode of operation of this semi-equipment in C language, etc. Such a schematic drawing is therefore usable in simulation software of an aircraft system.

Likewise, for the piece of semi-equipment (denoted 5 in FIG. 1) referenced R/TDO ("Plug in time delay opening relay"), the logical algorithm is:

```
IF X1=1 AND X2=1
  Then S1=E1 and S2=E2
  Else if (X1=0 and X2=1) or (X1=1 and X2=0) or (X1=0 and X2=0)
during (at least) 'TimeDelay'
  Then S1=0 and S2=0
```

Figure 6:
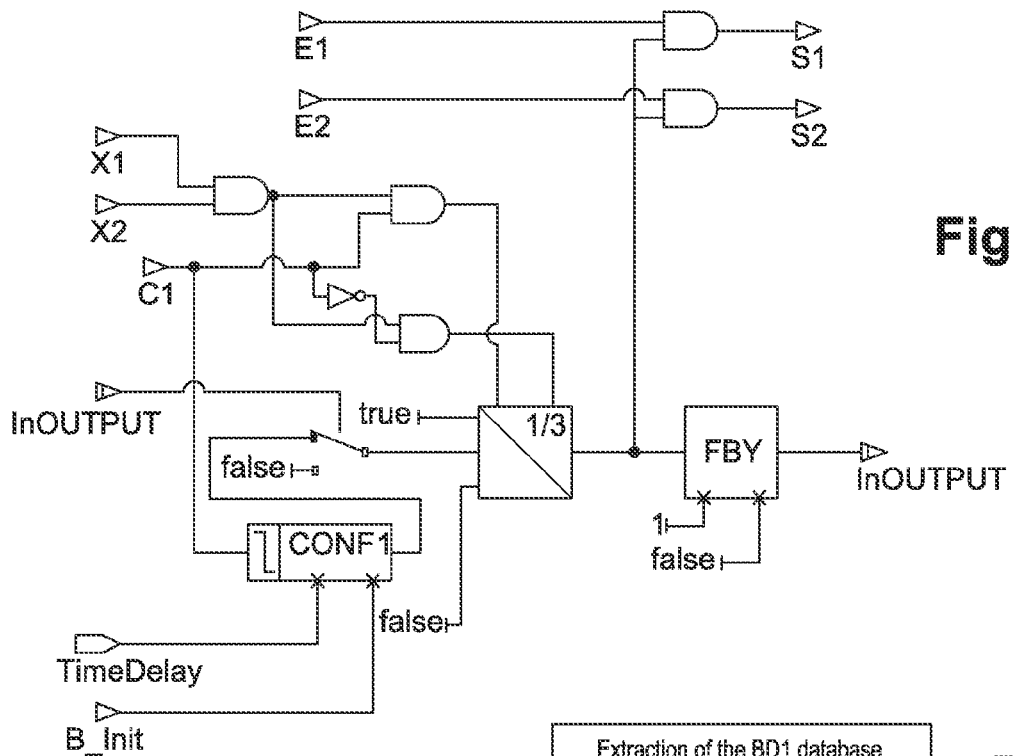
FIG. 6: A schematic drawing that is equivalent to the semi-equipment that is referenced R-TDO 19PE

And its associated schematic drawing is illustrated in FIG. 6.

The library S-E Library is thus constituted of simulation blocks that represent the majority of the semi-equipment that can thus be integrated generically into the simulation models. These generic blocks have identified inputs and outputs.

The role of this tool is to be used as an input of the automatic process for generating simulation boards and thus to connect the computers and the semi-equipment automatically by complying with the formalism of the wiring boards.

Once the semi-equipment is referenced, specified and coded according to the logic of formal, functional graphic schemas, their equivalent in code C is automatically generated using a tool that is known for automatic translation of graphic functional blocks into code C, and then integrated into a library S-E Library, usable for software written in the same language.

The simulation blocks should be compatible with the formalism of the database of wiring specifications BD1, i.e., each block is to comprise the standard of the simulated semi-equipment and the inputs/outputs should comprise the same name as the pins of the semi-equipment under BD1.

This library S-E Library is described here for the electric model of the aircraft but can naturally be extended to other models of the aircraft (hydraulic, fuel, engines, . . . ).

It is understood that this stage 102 can be implemented either by a human operator or, advantageously, at least for certain parts, by a computer program, for example for extracting the necessary data from a wiring database, or for analyzing the nomenclature of the semi-equipment according to a pre-existing database, or comparing this component to close components that are already identified, or for directly testing the component so as to determine its algorithm (i.e., its transfer function), or for coding an algorithm, written in the form of logical phrases, in a predetermined language.

The components that are listed in the wire table BD2 are then integrated (stage 103) into a meta simulation model in the form of formal, functional graphic schemas into a single node or several nodes, whereby each node represents a system ("ATA"), these systems exchanging information with one another. It is recalled that a simulation model mathematically comes in the form of a graph, whose nodes correspond to systems that are connected by functional interactions.

This integration is done by means of the library in the form of formal, functional graphic schemas by calling the different semi-equipment that is simulated based on the standards listed.

In this example, this task is carried out by a macro that develops the listing of semi-equipment in the wire table BD2, calling the various simulation blocks of the library S-E Library in the form of formal, functional graphic schemas based on the standard of this semi-equipment and attributing a name to this semi-equipment (the same name as in the database of wiring specifications BD1).

In the model that is generated, each simulation node simulates an ATA and each equation of this node simulates the corresponding sub-ATA.

By way of example, the relay that is referenced 15XE A is listed with the reference 'E0247AOS.' It calls the simulation block that is referenced under the same name and is integrated into the general node or node 24 (for the ATA 24, aircraft electrical system), equation 24, under the name 15XE A.

One example of a partial simulation board corresponding to the wiring board of FIG. 1 is illustrated in FIG. 5. Simulation blocks 2', 3', 4', 5', 12' that correspond respectively to the components 2, 3, 4, 5, 12 of the wiring board are recognized there. The simulation blocks are represented here by rectangles, whereby their internal logic is defined in the library S-E Library (the examples of simulation blocks of the components 2 and 5 are seen), and their inputs and outputs are pointed out with the pins of the connected components or the associated logic inputs.

Stage 104 is then the generation of the model.

In this stage 104, a simulation table TS is created by transformation of each line of the wire table BD2 by using transformation rules that are specific to each pair of pieces of equipment that are connected at two ends of each wire.

More specifically, once all of the pieces of semi-equipment of an ATA, a sub-ATA or the entire aircraft system are integrated within the 'screen' of the final model (stage 103), the object is to connect the inputs/outputs to one another.

One of the problems that is posed here is that of the direction of the wires connecting the components two by two, since the database of wiring specifications BD1 characterizes the connecting data of components by wires in a static manner, and not the operating data. It therefore does not involve a functional diagram ("Field Diagram" or FD in English).

A macro in the simulation software that works in the form of functional graphic blocks has been created. The object of this macro is to connect the inputs and the outputs of the components using the database of wiring specifications BD1 of wiring inputs and outputs.

The two inputs of this macro are therefore:

1/ On the one hand, the wire table BD2 of the inputs and outputs of each aircraft wire 2/ On the other hand, the screen of the model (the simulation blocks of the equipment and sub-equipment extracted from the library if they are part of the components that are connected at the ends of the wires that are listed in the wire table BD2) that is generated as described in the simplified example.

Thus, it is recalled that for each line in the new file in the form of a spreadsheet of the wire table BD2, a wire corresponds, as well as its two ends that each correspond to an input and an output of the semi-equipment that is already present in the model.

The object is therefore to extract its wires one by one and to connect them by means of the macro that contains the logic and the following hypotheses:

The fields 'ext1' and 'ext2' point toward the references of the two pieces of equipment or semi-equipment to be connected in the simulation software The fields 'BrNormal1' and 'BrNormal2' point toward the pins of the semi-equipment to be connected.

The fields 'TypeEQ1' and 'TypeEQ2' provide information on the category of connected components. Actually, certain pieces of semi-equipment are not coded in the library in the form of formal, functional graphic schemas (stage 103) and are therefore not integrated into the screen of the model like, for example, the grounds, the ending blocks, etc. It is therefore necessary to include in the code a default value for these elements (ex: 1 for the grounds).

Relative to the connectors, the two components that are connected to the same pin of a connector are connected by the same wire.

In the case where the entire aircraft system is not simulated, but only a sub-system, the E/S are not internal to the model; they should therefore be referenced as such ("NotUsed" +Reference of the semi-component+recurrence). If this is a non-referenced input in the model, it is selected to fix it at a default value (for example, 1).

The macro takes into account all of the inputs/outputs of the components that are integrated into the model in the form of formal, functional graphic schemas and connects them.

This macro can, for example, pass through the wire table BD2 line by line and initiate the loading of the software blocks for simulation of the semi-equipment library S-E Library corresponding to the end components of wires, incorporated in the code in the form of procedures, and then carry out the processing of the wires themselves by determining the direction of travel of the current that passes through them and their equivalent coding.

The determination, for all of the origins and destinations (Ext1 and Ext2) of the aircraft wiring, of their input or output nature uses an algorithm as follows:

1/ For all of the components that are listed in the semi-equipment library S-E Library, possible links between the pins of the connectors of this component are defined, 2/ Then, at least one of these points is identified as necessarily having to be an input or an output, starting from initial rules using the formal graphic definition of the semi-equipment, 3/ Then, finally, the natures of the different ends of all of the wires of the system that is to be simulated are propagated by routing (for example, the opposite end of an "input" on a wire is necessarily an "output").

Non-limiting examples of rules are provided here:

Rule 1: In a relay-type piece of semi-equipment, the pins X and Z are inputs

Rule 2: In a piece of semi-equipment that is known under the common name of three-phase "Circuit Breaker," the pins A2, B2, C2 are the inputs.

For the wires whose ends are not connected to components that are part of the library S-E Library of semi-equipment:

Rule 3: If the "pin-type" field has the value 1 (in) or if the symbol is of the "Circuit Breaker" type, the end is an input Rule 4: If the "Pin-type" field has the value 0 (Out), the end is an output.

If a ground is wired to a pin of a component, the end of the wire that is connected to this ground is an input, and, analogously, the logical value "TRUE" is associated with this ground.

If the component is a differential circuit-breaker switch RCCB ("Residual Current Circuit Breaker" in English), then:

Rule 5: The referenced pins cmd1 and cmd2 are outputs

Rule 6: The supply pin of the load is an input.

In the macro that generates XML code lines (or another that is compatible with the SCADE (registered trademark)-type software) defining the simulation blocks, a choice has been made to preserve the installation coordinates of the components of the initial wiring board, as installation coordinates for the display of the simulation board. These data were deliberately extracted from the database of wiring specifications BD1 and saved in the wire table BD2.

In this way, the verification by the developers of models of the conformity of the simulation board to the wiring board is greatly facilitated, because a visual superposition of the boards is obtained, whereby the simulation blocks of each component are superposed in the schema of the component and the oriented wires are superposed on the wires of the wiring board.

It is understood that the preceding description covers a process for automating the generation of simulation models, making it possible to connect the simulation models of computers and other primary components with simulation blocks that represent the semi-equipment, using data contained in the wiring boards (database exhaustively listing the inputs and outputs of each aircraft wire for the different systems).

It is therefore possible to start from the database of wiring specifications BD1 for inputs and output of all of the aircraft wiring to produce, automatically, a meta model in the form of formal, functional graphic schemas, in which all of the pieces of equipment and semi-equipment of the aircraft system are connected to one another.

This meta model is then coded in a computer language such as C or Ada and integrated directly into an aircraft simulator (stage 105).

Stage 105 therefore consists of the generation of a code that can be interpreted by a simulator.

In this stage 105, a set of computer code instructions that can be interpreted by a simulator is created by transformation of each line of the simulation table TS into a set of computer code lines according to the input and output equipment.

The process that was just described has numerous advantages:

The process ensures a better quality, a better traceability, and a safeguarded validation of the simulation models because of the exhaustive information of the aircraft wires in the database of wiring specifications BD1.

The macro that is developed in the software and that works in the form of functional graphic blocks does not need significant updates, and the advantage of the development of such a process is that it can easily be updated and applied to several types of aircraft with a fairly low maintenance cost.

A library S-E Library was developed in the form of formal, functional graphic schemas (for example in the XML language, of the SCADE (registered trademark)-type) of generic symbols (GSB) simulating the primary electronic semi-equipment. These symbols, validated and compiled, can be integrated generically into the simulation models without being the object of manual coding, which could prove different according to whether it is carried out by a developer of models, or another.

This library S-E Library provides complete information on all of the semi-equipment used and requires only a few changes for future aircraft.

VARIANTS OF THE INVENTION

The scope of this invention is not limited to the details of the embodiments considered above by way of example, but on the contrary extends to the modifications within the scope of one skilled in the art.

For the creation stage 102 of the library S-E Library of simulation blocks, it is known that there are conventionally several tens of thousands of standards in the database of wiring specifications of an aircraft, and that the creation of the library of corresponding simulation blocks S-E Library is a considerable work.

In one variant, it is possible to extract the frequency of use in the aircraft wiring for each component listed from the database BD1 and to initiate coding of the components in the library S-E Library by beginning with the most often used.

The process according to the invention can then be modified for pointing out during a request for creation of simulation of a system what components are not yet coded in the library S-E Library. It is then possible either to complete the library with components S-E Library or to automatically propose equivalent or similar components to the Model Developer who uses the process.

It is understood that the entire process for generation of functional digital simulation of an electronic system that was described can be used for software installed on a computer. It can also be used by a dedicated electronic circuit, for example, but not in a limiting way, of the FPGA type, comprising logic adapted to implement the process as described.

In the same way, the process for generating functional digital simulation of an electronic system, as described, can be an integral part of an electronic system simulator, as a first stage in the operation of said simulator, used to configure it according to the electronic system that is to be simulated.

The invention claimed is:

1. A process for generating a functional digital simulation of an operation of an electronic system comprising wires and equipment connected by wires, the digital simulation being generated from a wiring specification base BD1 of the electronic system that lists all inputs and outputs of each wire in the electronic system and lists nomenclature for each end of each wire, a type of equipment that is connected at each end of each wire, and reference indicators for the equipment, and lists any system or sub-system on which each wire depends, the process comprising:
creating a wire table BD2 by selection and extraction of data from the wiring specification base BD1, the wire table BD2 including a reference to equipment to which each wire end is connected and a classification category of said equipment for each wire to be included in the digital simulation, the wire table BD2 creating a line of data for each wire;
creating a simulation table TS by transformation of each line of the wire table BD2 by using transformation rules that are specific to each pair of pieces of equipment connected at two ends of each wire;
creating a set of computer code instructions that can be interpreted by a digital simulator through transformation of each line of the simulation table TS into a set of computer code lines according to the input and output equipment; and
performing a digital simulation of the electronic system based on the created set of computer code instructions.

2. A process according to claim 1, further comprising:
creating a semi-equipment library that defines a logical functioning algorithm, stored in the form of a formal, functional graphic schema that uses elementary predefined representation blocks, for a set of at least one piece of equipment of the electronic system designated as a piece of semi-equipment.

3. A process according to claim 2, further comprising:
integrating pieces of equipment and semi-equipment listed in the wire table BD2 in a meta simulation model in using formal, functional graphic schemas made of a single node or several nodes, whereby each node represents a system.

4. A process according to claim 3, wherein in the meta simulation model, each simulation node simulates a system and each equation of each node simulates corresponding subsystems.

5. A process according to claim 4 wherein the creating of simulation table TS implements a connecting function written in simulation software working in the form of functional graphic blocks in order to connect the inputs and the outputs of the equipment and semi-equipment using the database BD1 of wiring inputs and outputs such that two inputs of the connecting function correspond to either:
   a) the wire table BD2 of the inputs and outputs of each aircraft wire; or
   b) a screen of the meta simulation model including the simulation blocks of equipment and sub-equipment, extracted from the semi-equipment library if the inputs and outputs are part of the equipment and semi-equipment connected at the wire ends listed in the wire table BD2.

6. A process according to claim 4 wherein the database of wiring specifications BD1 also comprises for each wire references to wiring boards including the positions to which equipment or semi-equipment is to be drawn on the wiring board,
   wherein the wire table BD2 corresponds to at least one wiring board,
   wherein the wire table BD2 also comprises design coordinates for each piece of equipment or semi-equipment on each wiring board, and
   wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

7. A process according to claim 4, wherein the simulation table TS is created in an XML-type graphic language.

8. A process according to claim 3 wherein the creating of simulation table TS implements a connecting function written in simulation software working in the form of functional graphic blocks in order to connect the inputs and the outputs of the equipment and semi-equipment using the database BD1 of wiring inputs and outputs such that two inputs of the connecting function alternatively:
   a) the wire table BD2 of the inputs and outputs of each aircraft wire; or
   b) a screen of the meta simulation model including the simulation blocks of equipment and sub-equipment, extracted from the semi-equipment library if the inputs and outputs are part of the equipment and semi-equipment connected at the wire ends listed in the wire table BD2.

9. A process according to claim 8, wherein the connecting function reads through the wire table BD2 line by line;
   proceeds as software blocks for simulation comprising formal, functional graphic schemas of the semi-equipment library corresponding to wire-end equipment and semi-equipment, are loaded and incorporated into the code in the form of procedures;
   processes the information of each wire itself by determining the direction of passage of the current that runs through each wire and its equivalent coding.

10. A process according to claim 9, wherein the determination of origins and destinations of each wire in the electronic system and the nature of the wire input or output is performed according to:
   a) defining the possible links between pins of connectors for all of the semi-equipment listed in the semi-equipment library;
   b) setting at least one end of one wire of the electronic system as an input or an output starting from a set of initial rules using the formal, functional graphic schema of the semi-equipment; and
   c) determining the nature of the ends of each wire of the system that is to be simulated by routing one end of one piece of equipment or semi-equipment to another end of the piece of equipment or semi-equipment, and one end of one wire to the other end of this same wire.

11. A process according to claim 10 wherein the database of wiring specifications BD1 also comprises for each wire references to wiring boards including the positions to which equipment or semi-equipment is to be drawn on the wiring board,
   wherein the wire table BD2 corresponds to at least one wiring board,
   wherein the wire table BD2 also comprises design coordinates for each piece of equipment or semi-equipment on each wiring board, and
   wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

12. A process according to claim 9 wherein the database of wiring specifications BD1 also comprises for each wire references to wiring boards including the positions to which equipment or semi-equipment is to be drawn on the wiring board,
   wherein the wire table BD2 corresponds to at least one wiring board,
   wherein the wire table BD2 also comprises design coordinates for each piece of equipment or semi-equipment on each wiring board, and
   wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

13. A process according to claim 8 wherein the database of wiring specifications BD1 also comprises for each wire references to wiring boards including the positions to which equipment or semi-equipment is to be drawn on the wiring board,
   wherein the wire table BD2 corresponds to at least one wiring board,
   wherein the wire table BD2 also comprises design coordinates for each piece of equipment or semi-equipment on each wiring board, and
   wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

14. A process according to claim 3 wherein the database of wiring specifications BD1 also comprises for each wire references to wiring boards including the positions to which equipment or semi-equipment is to be drawn on the wiring board,
   wherein the wire table BD2 corresponds to at least one wiring board, wherein the wire table BD2 also comprises design coordinates for each piece of equipment or semi-equipment on each wiring board, and wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

15. A process according to claim 3, wherein the simulation table TS is created in an XML-type graphic language.

16. A process according to claim 2 wherein the database of wiring specifications BD1 also comprises for each wire references to wiring boards including the positions to which equipment or semi-equipment is to be drawn on the wiring board, wherein the wire table BD2 corresponds to at least one wiring board, wherein the wire table BD2 also comprises design coordinates for each piece of equipment or semi-equipment on each wiring board, and wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

17. A process according to claim 2, wherein the simulation table TS is created in an XML-type graphic language.

18. A process according to claim 1 wherein the database of wiring specifications BD1 also comprises for each wire references to wiring boards including the positions to which equipment or semi-equipment is to be drawn on the wiring board, wherein the wire table BD2 corresponds to at least one wiring board, wherein the wire table BD2 also comprises design coordinates for each piece of equipment or semi-equipment on each wiring board, and wherein the simulation table TS also comprises design coordinates of each simulation block of a piece of equipment or semi-equipment on a simulation board, whereby the coordinates are selected to be identical to the design coordinates of said equipment or semi-equipment in the wire table BD2.

19. A process according to claim 1 wherein the simulation table TS is created in an XML-type graphic language.

20. A computer program product comprising a set of program code instructions for implementing a process according to claim 1 when said program is executed on a computer.

* * * * *